(12) United States Patent
Yang et al.

(10) Patent No.: US 11,829,687 B2
(45) Date of Patent: Nov. 28, 2023

(54) METHOD FOR INVERSION OF CORRESPONDING LINE MILEAGE AND OFFSET BY USING KNOWN COORDINATE POINT

(71) Applicant: CHINA RAILWAY NO. 2 ENGINEERING GROUP CO., LTD., Chengdu (CN)

(72) Inventors: Weiyu Yang, Chengdu (CN); Zhang Yang, Chengdu (CN); Shi Zhou, Chengdu (CN); Kaosheng Wang, Chengdu (CN); Lizheng Liu, Chengdu (CN); Hua Jiang, Chengdu (CN); Yong Yan, Chengdu (CN); Jun He, Chengdu (CN); Taisheng Duan, Chengdu (CN); Ping Guo, Chengdu (CN)

(73) Assignee: China Railway No. 2 Engineering Group Co., Ltd., Chengdu (CN)

( * ) Notice: Subject to any disclaimer, the term of this patent is extended or adjusted under 35 U.S.C. 154(b) by 0 days.

(21) Appl. No.: 18/308,286

(22) Filed: Apr. 27, 2023

(65) Prior Publication Data
US 2023/0259668 A1    Aug. 17, 2023

Related U.S. Application Data

(63) Continuation of application No. PCT/CN2021/079198, filed on Mar. 5, 2021.

(30) Foreign Application Priority Data

Dec. 28, 2020    (CN) .......................... 202011581402.7

(51) Int. Cl.
  *G06F 30/13*    (2020.01)
(52) U.S. Cl.
  CPC .................................. *G06F 30/13* (2020.01)

(58) Field of Classification Search
  CPC .................................. G06F 30/00; G06F 30/13
  (Continued)

(56) References Cited

U.S. PATENT DOCUMENTS

2010/0289802 A1    11/2010    Falchetto

FOREIGN PATENT DOCUMENTS

| CN | 1044716 A | 8/1990 |
|---|---|---|
| CN | 108520120 A | 9/2018 |

(Continued)

OTHER PUBLICATIONS

International Search Report; International Patent Application No. PCT/CN2021/079198; dated Sep. 28, 2021; China National Intellectual Property Administration (ISA/CN), Beijing, China.

(Continued)

*Primary Examiner* — Cedric Johnson
(74) *Attorney, Agent, or Firm* — Andrew D. Fortney; Central California IP Group, P.C.

(57) ABSTRACT

A method for inversion of a path mileage and offset by using a known coordinate point, comprising: based on coordinates of a known point P and curve elements of a start location and an end location of a curve element, first segmenting or not segmenting the curve element according to a corner of the curve element to obtain a plurality of curve sub-elements (AiBi), and calculating curve elements of the curve sub-elements (AiBi); taking any curve sub-element (AiBi) to calculate a half chord length S and a straight corner θ, and performing precision determination and convergence correction according to S and θ, the point P being always effective with respect to the curve sub-element (AiBi) in the correction process; and performing cyclic convergence calculation to finally obtain a distance from the point P to any point on a chord line or an arc line as an offset of the curve sub-element (AiBi) corresponding to the point P and to (Continued)

obtain a mileage of the curve sub-element (AiBi) corresponding to the point P. By calculating different curve sub-elements (AiBi), an effective offset and an effective mileage of the curve sub-element (AiBi) corresponding to the point P can be finally obtained. The method is suitable for mileage inversion of curve elements which comprise a large-corner curve element, the calculation process is always converged, the situation that calculation cannot be performed is avoided, and the calculation process is relatively simple.

11 Claims, 3 Drawing Sheets

(58) Field of Classification Search
USPC .............................................................. 703/1
See application file for complete search history.

(56) References Cited

FOREIGN PATENT DOCUMENTS

| CN | 110172981 | A | * | 8/2019 | | |
| CN | 110348170 | A | * | 10/2019 | ......... | G06F 17/5004 |
| CN | 110348170 | A | | 10/2019 | | |
| CN | 111597509 | A | * | 8/2020 | | |
| CN | 111597509 | A | | 8/2020 | | |

OTHER PUBLICATIONS

Lu. Yingang; "Research on Reverse-Calculation of Center Stake Mileage and Setover via Any Coordinate in Range of Highway Curve," Mine Surveying, No. 3, Jun. 30, 2009 (Jun. 30, 2009), pp. 76-80; ISSN: 1001-358X.

* cited by examiner

METHOD FOR INVERSION OF CORRESPONDING LINE MILEAGE AND OFFSET BY USING KNOWN COORDINATE POINT

CROSS-REFERENCE TO RELATED APPLICATIONS

The present application is a continuation of International Pat. Appl. No. PCT/CN2021/079198, filed Mar. 5, 2021, pending, which claims priority to Chinese Pat. Appl. No. 202011581402.7, filed Dec. 28, 2020, both of which are incorporated herein by reference.

TECHNICAL FIELD

The invention relates to the field of engineering technology, in particular to a method for inversion of the corresponding line or path mileage and offset by using one or more known coordinate points.

BACKGROUND

In the design and construction of railway, highway and other line projects, it is often necessary to determine in advance whether the existing buildings or other objects are within the red line of the line project, whether the subgrade and bridge under construction are constructed at the designed position, and whether any point of the tunnel lining intrudes into the building limit. The general practice is to measure the actual coordinates of related buildings or target points, and then calculate the line mileage and offset corresponding to the coordinates; By comparing the back-calculated value with the offset distance corresponding to the design mileage, we can determine whether the related buildings are within the red line of the line project, whether the measured subgrade is filled to the design width, whether the bridge pier and abutments are constructed to the design position, and whether the tunnel fault surface intrudes into the building limit. Through the above methods, the relationship between existing structures and lines and the line direction can be determined, and the construction can be guided according to the calculation results. In the actual line engineering, many problems can be avoided in advance by evaluating the feasibility of the design line in advance through the inverse calculation method of the corresponding line or path mileage and offset of the existing structure. Therefore, it is a practical and regular technical method to repeatedly calculate and confirm the mileage and offset of the corresponding design line of the existing structure and the structure under construction before and during the design and construction.

At present, some existing calculation methods are limited by their calculation methods, but there are still some insurmountable problems in their application. For example, the back calculation method of using the known point as the tangent perpendicular to the starting point of the curve element and accumulating the tangent vertical distance approaches, when some known points get new mileage by increasing the tangent vertical distance, the vertical foot of P point relative to the new tangent may be in the direction of small mileage again, thus forming an infinite loop after repeated calculation; However, the vertical line of the tangent of some known points for calculating mileage may exceed this curve element, and these situations may result in the failure of the inverse calculation, which may result in the failure of the inverse calculation. In addition, some attempts have been made to solve the equations by analytical method, which needs to solve higher-order equations, so the overall calculation is very difficult, and the actual application effect is not friendly. Therefore, it is necessary to provide a method of inverse calculation of line mileage and offset based on the obtained coordinates, curve elements and other data, aiming at any curve element at any corner, which is always convergent and effective and simple to solve.

SUMMARY

The purpose of the present invention is to overcome the problems existing in the prior art, such as that the mileage cannot be inversely calculated for any rotation angle, the calculation result is not necessarily convergent and effective, and the calculation is difficult, and to provide a method for inversely calculating the line mileage and offset based on the obtained data such as coordinates and curve elements, which is always convergent and effective for any rotation angle and is relatively simple to solve.

Specifically, the invention provides the following technical scheme:

A method for inversely calculating the mileage and offset of a path using known locations (coordinate points), which is characterized by including the following steps:

1) Measure the coordinates of point P and the curve elements of the curve element to obtain the rotation angle $\beta$ of the curve element, where point P is the actual position of the area to be constructed, divide the curve element into n segments curve sub-elements according to the preset rotation angle, and calculate the curve elements corresponding to the curve sub-element according to the curve elements of the curve element and the rotation angles of each segment curve sub-element, wherein the rotation angle of the curve element is greater than or equal to 0°, and the rotation angle of the curve sub-element is less than 180° and greater than or equal to 0°;

2) Take the connecting line between the start point $A_i$ and the ending point $B_i$ of the i-th segment curve sub-element as the chord line $A_iB_i$, take the $O_i$ point as the midpoint of the chord line $A_iB_i$, and calculate the straight-line rotation angle $\theta_i$ and the length $S_i$ of $A_iO_i$ or $B_iO_i$ according to the curve elements of the i-th segment curve sub-element and the coordinates of the point P, wherein the straight-line rotation angle $\theta_i$ is the included angle between the azimuth $t_{AiBi}$ and the azimuth $t_{OiP}$, and the straight-line rotation angle $\theta_i$ is less than 180° and greater than or equal to 0°; Azimuth $t_{AiBi}$ points from $A_i$ to $B_i$, and azimuth $t_{OiP}$ points from oi to point P;

3) If the cyclic condition that the length $S_i$ of $A_iO_i$ or $B_iO_i$ is greater than the preset precision is satisfied, the following judgment and correction are made:

If $\theta_i<90°$, let the correction mileage $L_i'=L_{Ai}+S_i$, where $L_{Ai}$ is the starting mileage of the i-th segment curve sub-element, and calculate the coordinates of the correction point and its tangent orientation of the correction mileage $L_i'$ corresponding to the i-th segment curve sub-element according to the curve elements of the i-th segment curve sub-element to obtain the i-th segment curve sub-element with the correction point as the start point and the $B_i$ point as the end point.

If $\theta_i \geq 90°$, let the correction mileage $L_i'=L_{Bi}-S_i$, where $L_{Bi}$ is the terminal mileage of the i-th segment curve sub-element, and calculate the coordinates of the correction point and its tangent orientation of the correction mileage $L_i'$ corresponding to the i-th segment curve sub-element according to the curve elements of the i-th segment curve sub-element to obtain the i-th segment correction curve sub-element with the correction point as the end point and the $A_i$ point as the start point.

Then, the i-th correction curve sub-element is used to replace the i-th curve sub-element and substituted into step 2);

If the cyclic condition that the length $S_i$ of $A_iO_i$ or $B_iO_i$ is greater than the preset precision is not satisfied, calculate the distance $F_{O_iP}$ from point P to $O_i$ as equal to the offset of the i-th segment curve sub-element corresponding to point P, take the middle mileage of the start point mileage and the end point mileage of the i-th segment curve sub-element as the mileage of the i-th segment curve sub-element corresponding to point P, and enter step 4);

4) Repeat steps 2) to 3) for all curve sub-elements until inverse calculating the mileage and offset of point P corresponding to all curve sub-element, and the effective mileage and offset of point P are determined in combination with the actual situation, and compared with the offset corresponding to the design mileage in the design stage to judge whether it meets the design requirements.

Among them, the curve elements include the mileage, radius, tangent azimuth and coordinates of the start point and the end point of the curve element or curve sub-element, the tangent azimuth of any mileage point of the curve element points to the mileage increasing direction, and n and i are integers greater than 0°.

First of all, the curve elements mentioned in this application include linear segments, circular curve segments, complete or incomplete cyclotron segment curve elements, and the curvature of any point on these curve elements changes linearly. In this application, the straight line segment is regarded as a special curve element, and the rotation angle of the curve element of the straight line segment is 0°, and the rotation angle of the curve element of the non-straight line segment is greater than 0°.

According to the technical scheme, inverse calculate the mileage and offset corresponding to various types of curve elements according to the known point coordinates and curve elements of curve elements. Because the inverse calculation of straight line segment and circular curve segment is simple, the inverse calculation method of offset and mileage in this technical scheme is especially suitable for the inverse calculation of mileage and offset of curve elements with large rotation angle, complete or incomplete gyration segment. In practical application, a line or line tuple is often obtained by combining multiple curve elements. According to the method described in this technical scheme, the effective mileage and effective offset of point P corresponding to different curve elements can be calculated, and the offset and mileage data of point P corresponding to the whole line or line tuple can be determined according to the actual situation, that is, the scheme of calculating the offset and mileage of any curve element with linear curvature change according to known points is given in this application. According to the calculation results, the feasibility of the design stage of the line where the curve element M is located or the deviation between the construction stage and the design value of the structure corresponding to point P can be finally judged, that is, the technical scheme can be applied to both the design stage and the construction stage of the line.

Firstly, the rotation angle R of a curve element is obtained, and the curve element is divided into n segments according to the preset rotation angle, that is, the rotation angle of each segment is known; Then, for any curve sub-element AB, calculate the curve elements of the curve sub-element, further calculate its semi-chord length (that is, the length of AO or BO) S and the straight line rotation angle θ, preset the semi-chord length S as the criterion of the cyclic condition, and when the cyclic condition is established, appropriately correct, shorten and replace the curve sub-element according to the semi-chord length S and the straight line rotation angle θ, and then carry out the next round of calculation until the cyclic condition is not established. At this time, the calculated offset Fop from point P to point O is regarded as equal to the offset of the i-th segment curve sub-element corresponding to point P, and the intermediate mileage between the starting mileage and the ending mileage of the i-th segment curve sub-element is taken as the mileage of the i-th segment curve sub-element corresponding to point P. Of course, in the concrete implementation, the technicians in this field can choose that the deviation from any point on AB chord or AB arc to point P is equal to the deviation of point P corresponding to subsegment I, and choose any mileage between the starting point mileage and the ending point mileage of subsegment I as the mileage of subsegment i corresponding to point P. This replacement belongs to the equivalent replacement of this technical scheme and should be regarded as essentially the same as this technical scheme.

In the above calculation process, since the semi-chord length S is always less than half of the arc length of the curve sub-element before correction and replacement (that is, the mileage difference between the end point and the starting point), the arc length of the modified curve sub-element can always be shortened by adding or subtracting the semi-chord length S and LA or LB to replace the atomic curve element, that is, the arc length can be continuously converged and approached, and the new starting point or end point of the modified curve sub-element can be determined by the size of the linear rotation angle θ. Make the corrected curve sub-element always ensure the existence of corresponding mileage and offset about point P, that is, the true offset and mileage of point P corresponding to the original curve sub-element are always in the adjusted curve sub-element, and continue to converge and calculate in the above way until the cycle condition is not established, at which time, the calculation result meeting the preset accuracy requirements can be output; Finally, the convergence calculation is carried out for all or part of the curve sub-elements, and the final result is obtained by comprehensive comparison with the actual situation.

Through the above method, different curve elements can be processed and calculated flexibly, especially the problem of back calculation of mileage and offset of large-angle curve elements that can't be processed at present, and the calculation process gradually converges, so that there will be no situation that the calculation process can't be calculated because of non-convergence. In addition, the whole calculation process only involves the relevant knowledge of analytic geometry, which is relatively simple as a whole, friendly to construction workers and has high popularization value.

In particular, in this technical scheme, the semi-chord length S is used as the accuracy judgment target, and other data directly extended from the semi-chord length S can also be used as the judgment target, such as 2 times or ½ of the semi-chord length S, and the simple replacement of the above judgment target also belongs to the scope of protection of this application.

The orientation mentioned in this application is the direction of quantification. Unless otherwise specified, such as the orientation $t_{AB}$ in this application is the orientation from point A to point B, and other similar orientations can be described with reference to this description.

For the convenience of description, this application adopts the description of the i-th segment curve sub-element. The i-th segment curve sub-element refers to any segment taken after a curve element is divided into n segment curve sub-elements, and when i is given different values, the i-th segment curve sub-element represents different segment curve sub-elements.

In addition, in step 4), the technicians in the field can clearly judge whether the offset is effective according to the actual position of point P, the track of the line, the offset value calculated corresponding to each segment curve sub-element, and the common sense in the field, that is, although it is not specified here, the technicians in the field can clearly judge whether the calculated offset value is effective according to the actual situation, thus forming a clear and complete technical scheme. For example, if the calculated object is a straight line segment and the P point is not in the middle area between the normal lines (or vertical lines) of the two ends of the straight line segment, after the offset value is calculated according to the technical scheme described in this application, the skilled person can easily judge that the offset value is invalid in combination with the actual situation mentioned above. For another example, the calculated offset is more than several times the maximum excavation width of the railway subgrade, or the offset passes through more than two curve sub-elements, which can be regarded as invalid offset.

As the preferred technical scheme of the present invention, in step 1), if the rotation angle of a curve element is greater than or equal to 180°, the curve element is divided into m segments of curve sub-elements with the same first rotation angle and 0-2 segments of curve sub-elements with second rotation angles, where n=m or n=m+1 or n=m+2, where m is integers greater than 0, and both the first rotation angle and the second rotation angle are less than 180°. The technical scheme provides a universal method for dividing curve elements, and through proper division or non-division, inverse calculating all corresponding mileage and offset of point P, curve elements and target line tuples. Generally speaking, when the rotation angle of the curve element is greater than or equal to 180°, the first rotation angle and the second rotation angle can be any angle value less than 180°, otherwise, the significance of segmentation will be lost, such as the common angles of 30°, 45°, 60°, 90° or other suitable angles, and technicians can choose them at will according to the actual situation, so they will not repeat them here.

It should be noted that when a curve element is segmented at a fixed angle, there are usually curve sub-elements with different rotation angles at the head end and/or the tail end of the curve. In order to avoid this situation, the number of segments can be set in advance, and equal rotation angle segmentation can be performed according to the rotation angle R of the curve element. In addition, the first corner and the second corner are used here to distinguish the curve sub-elements segmented with equal angles from the curve sub-elements remaining after segmentation, and to explain that the curve elements can be segmented with any angle less than 180°, but it cannot be understood that only the curve elements can be segmented with equal angles. According to this explanation, the above limitation should be understood as that the rotation angles of the curve sub-elements with m segment first corners are the same, but when there are two curve sub-elements with second corners, the rotation angles of the two curve sub-elements can be equal or unequal. Generally, two unequal second corners are not segmented from the start point and the end point of the curve element.

As the preferred technical scheme of the present invention, in step 1), if n≥2, increases in the sequence from the end mileage of the first segment curve sub-element to the end mileage of the nth segment curve sub-element, Starting from the start point of the curve element, taking the start point of the curve element as the start point of the first segment curve sub-element, and combining with the rotation angle of the first segment curve sub-element, the curve elements of the first segment curve sub-element are calculated by using the complex Simpson formula, and then the end point of the first segment curve sub-element is taken as the start point of the second segment curve sub-element, and the curve elements of the second segment curve sub-element are continuously calculated by combining with the rotation angle of the second segment curve sub-element, and the above steps are repeated to calculate the curve elements of all the segment curve sub-elements;

Or, starting from the end point of the curve element, taking the end point of the curve element as the end point of the nth segment curve sub-element, combining with the rotation angle of the n-th segment curve sub-element, using the complex Simpson formula to calculate the curve elements of the n-th segment curve sub-element, then taking the start point of the n-th segment curve sub-element as the end point of the (n-1)-th segment curve sub-element, continuing to calculate the curve elements of the (n-1)-th segment curve sub-element combining with the rotation angle of the (n-1)-th segment curve sub-element, and repeating the above steps.

The technical scheme provides an algorithm for calculating the curve elements of each curve sub-element according to the curve elements of the curve element and the curve corners of each curve sub-element. The idea is that the curve elements of each curve sub-element are calculated step by step from either end of the curve element to the other end by using the complex Simpson formula. The technical scheme aims to provide a relatively simple method for calculating the curve elements of a curve sub-element, and a person skilled in the art can also use other methods to calculate the curve elements of any curve sub-element.

As the preferred technical scheme of the invention, in step 3), the coordinates and tangent directions of the correction points on the i-th segment curve sub-element corresponding to the correction mileage $L_i'$ are calculated by using the complex Simpson formula.

The technical scheme provides a specific algorithm for correcting the coordinates of the mileage $L_i'$ on the i-th segment curve sub-element and its tangent orientation. This algorithm mainly uses the complex Simpson formula to calculate, with clear overall logic and simple calculation process.

As the preferred technical scheme of the present invention, after the end of step 1) and before the start of step 2), the validity of the curve sub-element is judged, and the effective curve sub-element is selected to enter step 2); If the normal line of the start point $A_i$ and the normal line of the end point $B_i$ of the curve sub-element intersect at point Di or are parallel to each other, the normal line cutting plane of the start point $A_i$ and the ending point $B_i$ of the curve sub-element forms several areas, and the curve sub-element located in the same area as point P is an effective curve sub-element.

This technical scheme provides a method for reducing the total calculation amount. This method judges the effectiveness of the curve sub-element before step 2), which can eliminate the related calculation of the curve sub-element which is far away from the position of point P and has great azimuth deviation, so it obviously has no practical significance, thus achieving the technical effect of reducing the total calculation amount.

For a certain curve sub-element, when the point P is far away from the curve sub-element or the deviation between the point P and the curve sub-element is large, it is meaningless for the point P to do mileage back calculation for the curve sub-element, and the curve sub-element is called invalid. For the invalid curve sub-element, it is directly regarded that the mileage and offset of the point P about the invalid curve sub-element do not exist.

For a certain curve sub-element, make the normal lines of the start point $A_i$ and the ending point $B_i$ of the curve sub-element. The two normal lines are parallel to each other or intersect at the di point, and the two normal lines cut the plane into several areas. When the point P and the curve sub-element are in the same area, the point P has practical offset and mileage for the curve sub-element, so the next calculation can be carried out. If the point P is not in the same area as the curve sub-element, the mileage and offset of the point P with respect to the curve sub-element do not exist directly, thus the subsequent calculation of the curve sub-element is omitted. Among them, when the curve sub-element is a straight line segment, its rotation angle is 0°, and the normal lines of its start point and end point are parallel to each other. At this time, the two normal lines divide the plane into three regions.

When the point P falls on the point Di, it is also considered that the point P is not in the same area as the curve sub-element, that is, the curve sub-element is regarded as invalid. The most obvious case of this situation is that the point P is the center of the circular curve segment.

As the preferred technical scheme of the present invention, the quantitative calculation method for judging the effectiveness of the i-th segment curve sub-element is as follows: calculating the rotation angle $\gamma_{i1}$ of the azimuth $t_{Ai}$ turning to the azimuth $t_{AiP}$ and the rotation angle $\gamma_{i2}$ of the azimuth $t_{Bi}$ turning to the azimuth $t_{BiP}$, if $\gamma_{i1}<0$ and $\gamma_{i2}>0$, the curve sub-element is a valid curve sub-element, otherwise it is an invalid curve sub-element, where $t_{Ai}$ and $t_{Bi}$ are the right normal line directions of the start point $A_i$ and the end point $B_i$ of the i-th segment curve sub-element. Set the clockwise rotation angle as positive, and the absolute values of $\gamma_{i1}$ and $\gamma_{i2}$ are less than 180°. Among them, the right normal line direction refers to the direction that any mileage point of the line points to the direction of mileage increase when the tangent direction turns 90° clockwise, which belongs to the common general knowledge in the field.

In this technical scheme, whether the curve sub-element is valid or not is determined by quantitative calculation of parameters such as curve elements and coordinates, in which parameters such as azimuth $t_{Ai}$ and $t_{Bi}$ can be simply calculated by curve elements of the i-th curve sub-element, and the azimuth $t_{Ai}$, $t_{BiP}$, $\gamma_{i1}$ and $\gamma_{i2}$ can be further calculated by combining the coordinates of point P, wherein the specific calculation method involves the basic operation of analytic geometry, which is not specifically explained here, but does not affect the technical personnel in this field to realize this technical scheme.

Through the analysis of $\gamma_{i1}$ and $\gamma_{i2}$, it is confirmed whether the point P is in the same area as the subsegment i, that is, whether the subsegment is effective for the point P can be quantitatively judged.

As the preferred technical scheme of the present invention, in step 3), the preset accuracy is less than or equal to 2 mm.

This technical scheme provides an implementation of cyclic conditions. Obviously, when the preset accuracy value S is large, the overall calculation amount is correspondingly reduced, and the corresponding calculation result accuracy is low; otherwise, the calculation accuracy is high, but the calculation amount is correspondingly increased. Considering the actual situation, the method that the preset accuracy is less than or equal to 2 mm in this technical scheme has a good balance and can meet most requirements of back calculation accuracy.

As the preferred technical scheme of the present invention, in step 3), if the cycle condition is not met, the distance $F_{OiP}'$ from point P to point $O_i$, the midpoint of $A_iB_i$ chord, is calculated as equal to the absolute value of the offset of point P corresponding to the i-th segment curve sub-element, and the formula for calculating the offset $F_{OiP}$ of point P corresponding to the i-th segment curve sub-element is as follows:

$$F_{OiP}=F_{OiP}'\times\text{sign}(\sin(t_{OiP}-t_{AiBi}))$$

If $F_{OiP}<0$, it is defined that point P is on the left side of the increasing direction of the mileage of the curve element in the i-th subsegment; If $F_{OiP}>0$, it is defined that point P is on the right side of the increasing direction of the mileage of the curve element in the i-th subsegment. In this technical scheme, after the end of the cycle, that is, after meeting certain calculation accuracy requirements, the distance $F_{OiP}'$ of $O_iP$ is regarded as equal to the absolute value of the offset of point P corresponding to the i-th segment curve sub-element, and then the offset $F_{OiP}$ of point P corresponding to the i-th segment curve sub-element is obtained through the above formula, and the offset value has a sign, so that the relative position of point P corresponding to the i-th segment curve sub-element can be directly judged, that is, it is located on the left or right side of the i-th segment curve sub-element. Specifically, according to the pros and cons of $F_{OiP}$, it is judged that the point P is on the left or right side in the mileage increasing direction of subsegment i, which is convenient for further design and calculation in the later stage. When $F_{OiP}<0$, the point P is the left side of the mileage increase direction of the curve sub-element of segment i, and on the contrary, the point P is on the right side of the mileage increase direction of the curve sub-element of segment i. This description also belongs to the common general knowledge in the field.

As the preferred technical scheme of the present invention, in step 4), if there are multiple offsets and mileage corresponding to point P, the first several offsets and their corresponding mileage from small to large in absolute value are selected as the effective offsets and mileage of curve elements corresponding to point P.

For a curve element, there may be multiple curve sub-elements that are valid about point P, so the mileage and offset corresponding to point P may be multiple. This technical scheme provides the simplest processing method, that is, selecting the first several offsets with the absolute value from small to large and their corresponding mileage as the effective offset and effective mileage of point P corresponding to the curve element. When the offset of the absolute value of point P to the curve element is smaller than the red line range, the offset of the absolute value is definitely outside the red line range, so this processing method is faster and simpler. In practical application, the technicians in this field should flexibly handle the calculation results according to the actual situation, which is a common knowledge in this field. Although it is not specified here, it will not affect the technicians in this field to realize this technical scheme.

As the preferred technical scheme of the present invention, in step 4), if there are multiple offsets and mileage of curve elements corresponding to point P, the offsets whose absolute values are less than a preset threshold and their corresponding mileage are selected as the effective offsets and mileage of curve elements corresponding to point P. In the technical scheme, a preset threshold is adopted and compared with a plurality of offset values so as to determine the effective offset. Among them, the preset threshold should be specifically set according to the construction situation. For example, when the maximum excavation width on the left and right sides of the subgrade is 80 m, the preset threshold can be 100 m or other reasonable values. Obviously, when the calculated offset value is greater than the preset threshold, the point P must be far away from the curve element or curve sub-element, and the mileage and offset value of the corresponding target line have no practical significance.

The method for reversely calculating the path mileage and offset from the known coordinate points has at least the following beneficial effects:

1) The curve sub-element is repeatedly corrected by correcting the mileage, and the calculation process always converges, and at the same time, the mileage and actual offset of the corresponding line or path at point P always fall on the corrected curve sub-element, so the calculation process of this method is always effective and effective results can always be obtained;

2) Through calculation of curve sub-elements segment, inverse calculate all the corresponding mileage and offset of each curve element corresponding to point P, including the curve element with large corner angle, and there is no omission;

3) The method described in this application only involves common mathematical tools such as plane analytic geometry, and the overall calculation process is relatively simple, and it can be programmed, which is friendly to technicians in the field and convenient for practical use;

4) According to different precision requirements, the precision and calculation amount of the calculation results can be flexibly controlled by preset precision, and the offset and corresponding mileage with high precision can be calculated when calculated by computer programs;

5) By judging the validity of the curve sub-elements before step 2), the calculation of invalid curve sub-elements can be omitted, so the calculation amount can be significantly reduced and the accuracy and integrity of the calculation results can be guaranteed.

DETAILED DESCRIPTION OF ILLUSTRATIVE EMBODIMENTS

The present invention will be further described in detail with reference to the attached drawings and specific embodiments. However, it should not be understood that the scope of the above subject matter of the invention is limited to the following embodiments. All technologies implemented based on the content of the invention belong to the scope of the invention.

Embodiment 1

Figure 1:
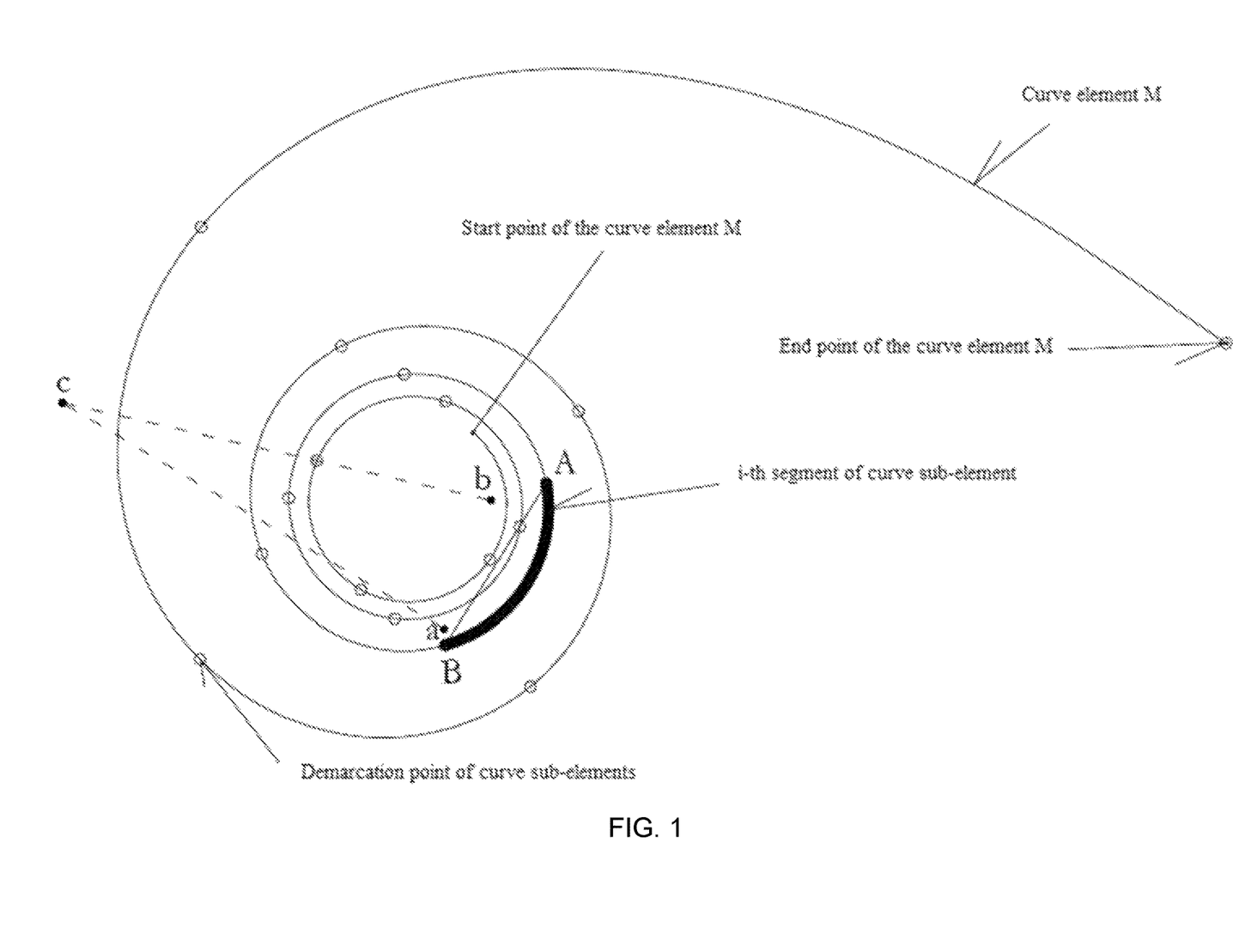
FIG. 1 is a schematic diagram of the process of splitting a curve element M into a plurality of curve sub-elements in embodiment 1.

Please refer to FIG. 1, in this embodiment, take the curve element M as an example, and inverse calculate the corresponding mileage and offset of three known coordinate points a, b, and c about the curve element M. Wherein, curve element M is a segment of curve element with mileage from 0+100 to 0+150 in the target line. Specifically, the starting mileage $L_1$ of curve element M is 0+100, the radius $R_1$ is 1, the ending mileage $L_2$ of curve element M is 0+150, and the radius $R_2$ is 800. Therefore, the curve type of curve element M is non-complete cycloid.

The coordinates of points a, b and c are known as follows:

| point name | x | y |
|---|---|---|
| a | −0.2885 | 202.1126 |
| b | 0.1889 | 200.7194 |
| c | −4.3570 | 199.6881 |

The curve elements of curve element M are as follows:

| curve element | mileage L | radius R | tangent azimuth T | x | y |
|---|---|---|---|---|---|
| start point | 100 | 1.000 | 40.00000° | 0.00000 | 200.00000 |
| end point | 150 | 800.000 | 34.18498094° | 8.00130 | 199.05367 |

The curve elements of the M-curve element specifically include:

Mileage $L_1$, radius $R_1$, tangent azimuth $T_1$ and coordinates $(x_1, y_1)$ of the starting point of the curve element;

Mileage $L_2$, radius $R_2$, tangent azimuth $T_2$ and coordinates $(x_2, y_2)$ of the end point of the curve element, Wherein, points a, b and c are respectively equivalent to the aforementioned point P.

In this embodiment, the rotation angles of the curve element and the curve sub-element are both greater than 0, and the tangent azimuths of each mileage point all point to the mileage increasing direction.

According to the above known conditions, firstly, inverse calculate the corresponding mileage and offset of point A with respect to the curve element M, specifically including the following steps:

1) According to the linear change of curvature at any point of gyration curve element, the curve rotation angle β of m curve element is calculated by the following formula:

$$\beta = \frac{1}{2}(\rho_2 + \rho_1)(L_2 - L_1) \quad (1)$$

Where $L_1$ is the mileage of the start point of the curve element M, $L_2$ is the mileage of the end point of the curve element M, $\rho_1$ is the curvature of the start point of the curve element M, $\rho_2$ is the curvature of the end point of the curve element M, It is easy to get: $\rho_1=1/R_1$, $\rho_2=1/R_2$;

According to formula (1), the rotation angle β=1434.184981° (for the convenience of description and calculation, both the arc system and the angle system are adopted in this application). R is greater than 180°.

The curve element M is divided into 17 curve sub-elements with the rotation angle of each curve sub-element close to 90° by the method of equal rotation angle, then n=17, and the curve rotation angle of each curve sub-element δ=β/n=84.3638224°. Assume that increases in sequence from the end mileage of the first segment curve sub-element to the end mileage of the nth segment curve sub-element.

Of course, a person skilled in the art can also segment the curve element M according to a preset rotation angle with a fixed size, or can segment it according to other similar methods.

After dividing the curve element M into 17 segments according to the method of equal rotation, each curve sub-element is taken in turn from the start point of the curve element M, and the curve element of the end point of the curve sub-element is calculated according to the curve element of the start point of each curve sub-element, and the curve element of the end point of the curve sub-element is taken as the curve element of the start point of the next curve sub-element to calculate the curve element of the next curve sub-element.

That is, when calculating the curve element of the end point of the first segment curve sub-element, the start point of the curve element M is taken as the start point of the first segment curve sub-element; According to the rotation angle θ of the first segment curve sub-element, the mileage and curvature of the end point of the first segment curve sub-element are calculated, and the coordinates of the end point of the first segment curve sub-element, tangent azimuth and other curve elements are calculated by using the complex Simpson formula;

When calculating the curve elements of the end point of the second segment curve sub-element, the curve elements of the end point of the first segment curve sub-element are taken as the curve elements of the start point of the second segment curve sub-element, the mileage and curvature of the end point of the second segment curve sub-element are calculated according to the rotation angle θ of the second segment curve sub-element, and the coordinates of the end point of the second segment curve sub-element, tangent azimuth and other curve elements are calculated by using the complex Simpson formula. And so on to get the curve elements corresponding to the required curve sub-elements.

Wherein, when calculating the curve elements of the end points of the first segment curve sub-elements, let:

$$g = 4 \times \rho_{11}^3 + 8 \times \delta \times \frac{\rho_2 - \rho_{11}}{L_2 - L_{11}}, \quad (2)$$

The mileage of the end point of the first segment curve sub-element:

$$L_{12} = L_{11} + \frac{-2 \times \rho_{11} + \sqrt{g}}{2 \times (\rho_2 - \rho_{11})/(L_2 - L_{11})} \quad (3)$$

The curvature and radius of curvature of the end point of the first segment curve sub-element are respectively:

$$\rho_{12} = \rho_{11} + \frac{\rho_3 - \rho_{11}}{L_2 - L_{11}} \times (L_{12} - L_{11}) \quad (4)$$

$$R_{12} = \frac{1}{\rho_{12}} \quad (5)$$

In Formula (2), Formula (3) and Formula (4), δ is the rotation angle of the first segment curve sub-element, $L_2$ is the terminal mileage of the curve element M, $\rho_2$ is the curvature of the end point of the curve element M, $L_{11}$ and $L_{12}$ are the mileage of the start and end points of first segment curve sub-element respectively, $\rho_{11}$ and $\rho_{12}$ are the curvatures of the start and end points of first segment curve sub-element, respectively.

$R_{11}$ and $R_{12}$ are the radius of curvature of the start and end points of the first subsegment, respectively, where $\rho_{11}=1/R_{11}$, Obviously, the curve elements of the start point of the first segment curve sub-element are the same as those of the start point of the curve element M. That is, the tangent azimuth $T_{11}$ of the start point of the first curve sub-element is equal to the tangent azimuth $T_1$ of the starting point of the curve element M, and its coordinates $x_{11}$ and $y_{11}$ are equal to the coordinates x and y of the start point of the curve element M. Then, the tangent azimuth $T_{12}$ and coordinates $(x_{12}, y_{12})$ of the end point of the first segment curve sub-element are calculated by using the complex Simpson formula, that is, the curve elements of the end point of the first segment curve sub-element are obtained.

For the second segment curve sub-element, take the end point of the first segment curve sub-element as the start point of the second segment curve sub-element, and continue to obtain the curve elements of the end point of the second segment curve sub-element according to the above method. By analogy, the curve elements of all curve sub-elements are obtained;

Of course, those skilled in the art can also perform operations in the direction from the end point to the start point of the curve element, and the calculation methods are completely consistent;

By the way, it is pointed out that for a circular curve segment, after dividing the curve element into n segments, it is easy to calculate the mileage, curvature and curve elements of the start and end points of each curve sub-element according to the curve angle of each curve sub-element, and this method is not elaborated.

Figure 2:
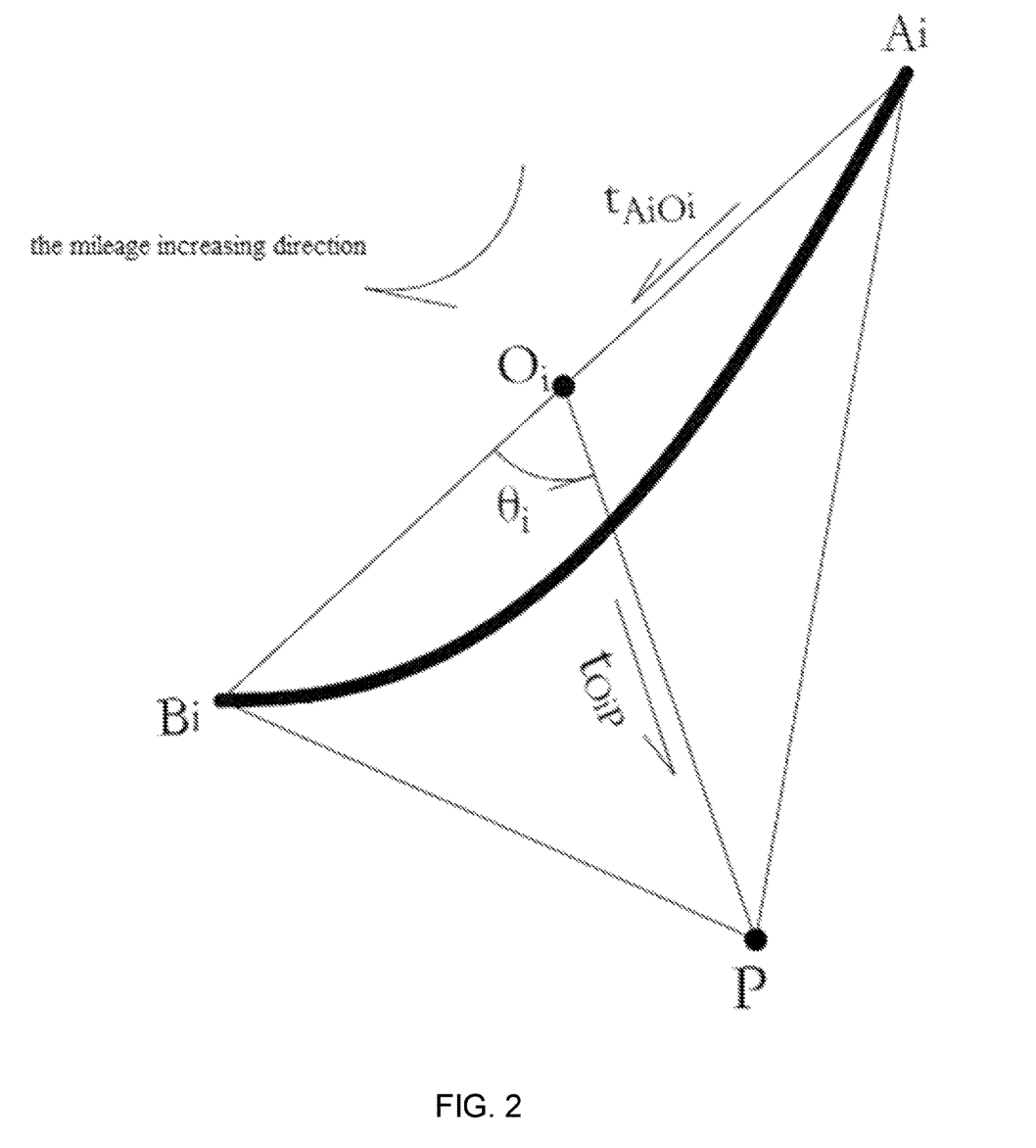
FIG. 2 is a schematic diagram of the calculation and processing of the i-th segment curve sub-element in Embodiment 1.

2) Please refer to FIG. 2, for the convenience of description, let the known coordinate point A be equivalent to point P in the figure, that is, point A represents point P. For the i-th segment curve sub-element, the connecting line between the start point $A_i$ and the end point $B_i$ is the chord line of this segment curve sub-element, and the midpoint of the chord line is $O_i$, then the length $S_i$ and the straight line rotation angle $θ_i$ of $A_iO_i$ or $B_iO_i$ are calculated according to the curve elements of the i-th segment curve sub-element and the coordinates of point A, where the straight line rotation angle $θ_i$ refers to the angle between the azimuth $t_{A_iB_i}$ and the azimuth $t_{O_ia}$, and the straight line rotation angle $θ_i$ is less than 180° and the minimum is 0°, and in this embodiment, the straight line rotation angle $θ_i$ is equal to 0°. Because the coordinates of point $A_i$, $B_i$ and point a are known or have been calculated, it is easy to calculate the above data by analyzing the geometric content in a conventional way, and will not be described in detail here.

3) According to the calculation result of step 2), if the i-th segment curve sub-element satisfies the cyclic condition that the length $S_i$ of $A_iO_i$ or $B_iO_i$ is greater than the preset precision, the following judgment and correction are made. In this embodiment, the preset precision is set to 2 mm:

If $\theta_i<90°$, let the correction mileage $Li'=L_{Ai}+S_i$, wherein $L_{Ai}$ is the starting mileage of the i-th segment curve sub-element, and calculate the coordinates of the correction point and its tangent orientation of the correction mileage $L_i'$ corresponding to the i-th segment curve sub-element according to the curve elements of the i-th segment curve sub-element, so as to obtain the i-th segment correction curve sub-element with the correction point as the start point and the Bi point as the end point.

If $\theta_i \geq 90°$, let the corrected mileage $Li'=L_{Bi}-Si$, where $L_{Bi}$ is the terminal mileage of the i-th segment curve sub-element, calculate the coordinates of the correction point and its tangent orientation of the corrected mileage $L_i'$ corresponding to the i-th segment curve sub-element according to the curve elements of the i-th segment curve sub-element, and obtain the i-th segment curve sub-element with the correction point as the end point and the $A_i$ point as the start point.

In this embodiment, the complex Simpson formula is used to calculate the coordinates and tangent directions of the correction points on the i-th segment curve sub-element corresponding to the correction mileage $L_i'$.

Then, the i-th correction curve sub-element is used to replace the i-th curve sub-element and substituted into step 2);

If the cycle condition that the length $S_i$ of $A_iO_i$ or $B_iO_i$ is greater than the preset precision is not satisfied, calculate the distance $F_{Oia}'$ from point a to $O_i$ at this time and consider it equal to the absolute value of the offset of the i-th segment curve sub-element corresponding to point a. At this time, take the middle mileage between the start point mileage and the end point mileage of the i-th segment curve sub-element as the mileage of point a corresponding to the i-th segment curve sub-element. In addition, in order to judge that point a falls on the left or right side of the i-th segment curve sub-element, calculate $F_{Oia}$ according to the following formula:

$$F_{Oia}=F_{Oia}'\times\text{sign}(\sin(t_{Oia}-t_{AiBi})) \quad (6)$$

If $F_{Oia}<0$, it is defined that point a is on the left side of the increasing direction of the mileage of the curve element in segment i; If $F_{Oia}>0$, it is defined that point a is on the right side of the increasing direction of the mileage of the curve element in the i-th subsegment.

After the calculation is completed, proceed to step 4),

4) For other curve sub-elements, repeat steps 2) and 3) until inverse calculate the mileage and offset of all curve sub-elements corresponding to point a, and finally the effective mileage and offset of curve element Ms corresponding to point a are comprehensively determined.

After calculating and determining the effective mileage and effective offset of point a, continue to determine all the mileage and offset of curve element Ms corresponding to points b and c according to the above method and determine the effectiveness of offset and mileage.

According to the calculation results of points a, b and c, the two values with the minimum absolute value of each point are finally selected for comprehensive judgment.

According to this method, all the inverse calculation mileage and offset results of curve element Ms corresponding to points a, b and c are shown in the following table:

| known coordinate point | | | inverse calculation mileage | inverse calculation offset | inverse calculation effectiveness |
|---|---|---|---|---|---|
| point name | x | y | | | |
| a | −0.2885 | 202.1126 | KK0 + 102.210 | −0.364 | |
| | | | KK0 + 109.300 | −0.184 | * |
| | | | KK0 + 117.890 | 0.138 | * |
| | | | KK0 + 129.596 | 0.982 | |
| b | 0.1889 | 200.7149 | KK0 + 100.814 | 0.169 | * |
| | | | KK0 + 107.664 | 0.332 | |
| | | | KK0 + 115.831 | 0.610 | |
| | | | KK0 + 126.479 | 1.252 | |
| c | −4.357 | 199.6881 | KK0 + 104.490 | −2.753 | |
| | | | KK0 + 112.006 | −2.539 | |
| | | | KK0 + 121.413 | −2.119 | |
| | | | KK0 + 135.766 | −0.612 | * |

It should be noted that a person skilled in the art can also directly regard the distance $F_{Oia}'$ from point a to point $O_i$, the midpoint of $A_iB_i$ string, as equal to the offset of point A corresponding to the i-th curve sub-element. This offset is not positive or negative, and it is still necessary to judge the left-right relationship of point a relative to each curve sub-element in the later application. Therefore, it is more practical for this embodiment to obtain the offset with positive or negative through the above formula.

The inverse calculation offset marked with * in the table and the corresponding inverse calculation mileage are respectively the final confirmed effective offset and mileage of points a, b and c relative to the curve element M.

Among them, the method to confirm the validity of the inverse calculation result is: for any calculation point of a, b and c, such as point a, select the first two offsets of the absolute value of the offset of the curve element M corresponding to point a from small to large and their corresponding mileage as effective values, then set a preset threshold, and conduct secondary screening through the preset threshold. If the absolute value of the offset is greater than the preset threshold, the offset is invalid, otherwise, it is. Engineers and technicians in this field can preset the threshold according to their needs, such as setting it according to the widest value of the subgrade of the target line or setting it according to the widest red line value of the bid segment, etc.

According to FIG. 1, any point of a, b and c has only one or two effective offsets and mileage with respect to the curve element M. Since point b exists inside the whole of the curve element M and point c exists outside the whole of the curve element M, there is only one effective offset and its corresponding mileage for both points b and c, and there are two effective offsets and their corresponding mileage for point a. Assuming that the offset of point c exceeds a preset threshold, then point c has no effective offset and mileage for the curve element M.

In this embodiment, all curve sub-elements of the curve element M are calculated about points a, b and c, and this calculation method can ensure the gradual convergence of the calculation process, so there will be no problem that it cannot be calculated; By using the subsegment method, the corresponding mileage and offset will not be omitted, and finally all the back calculation data of the corresponding mileage and offset with controllable accuracy can be obtained; According to the validity judgment of the offset, all the effective corresponding mileage and offset back calculation data with controllable accuracy can be obtained.

Compared with solving the equation, this embodiment is more friendly in calculation amount and difficulty, and has higher popularization value.

Embodiment 2

Figure 3:
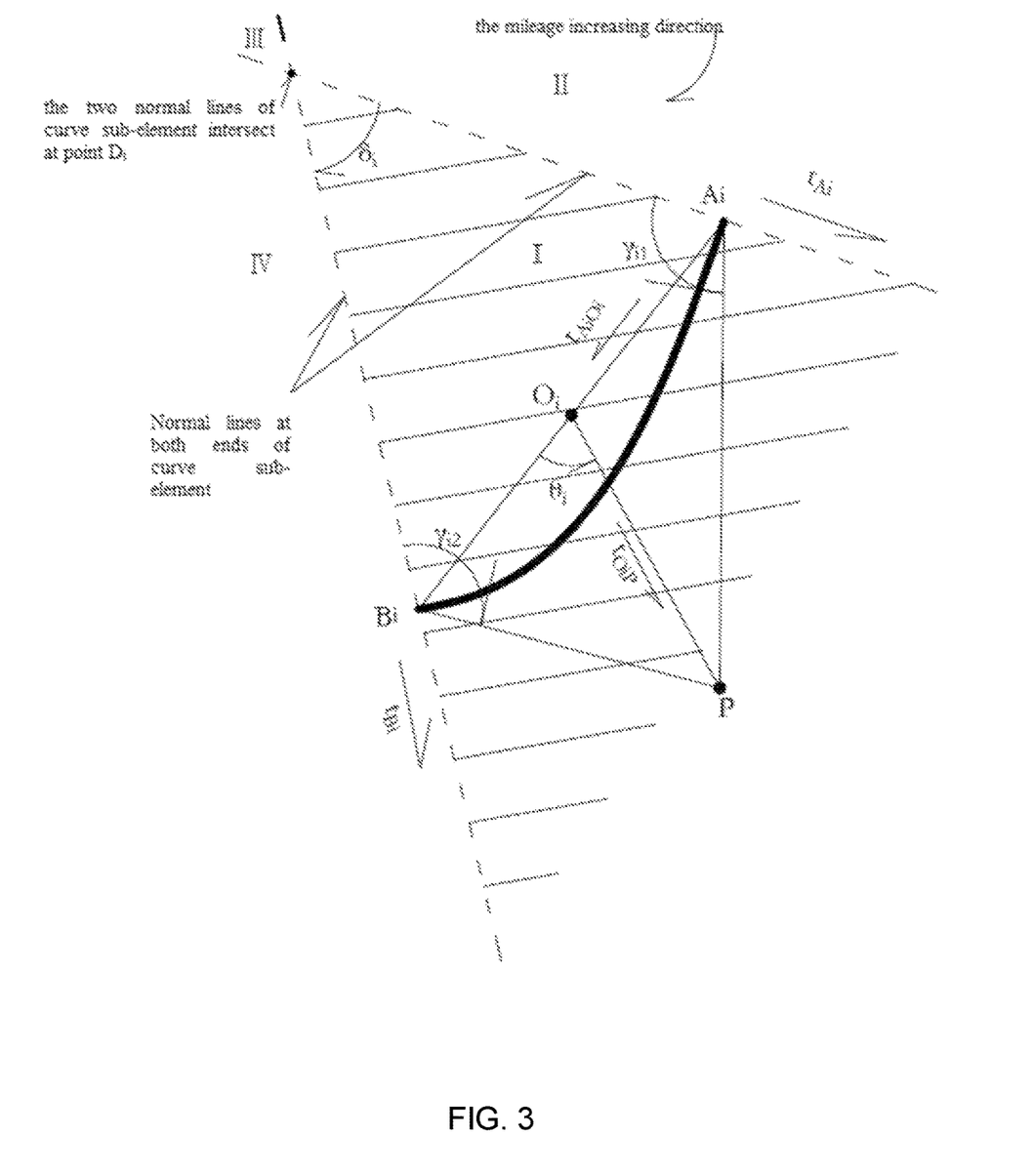
FIG. 3 is a schematic diagram of the validity judgment processing for the i-th segment curve sub-element in embodiments 2 and 3.

On the basis of Embodiment 1, in this embodiment, after the end of Step 1) and before the start of Step 2) of the method of Embodiment 1, the step of determining the validity of the curve sub-element is added, specifically:

Please refer to FIG. 3, in which point P stands for point a in this embodiment. With respect to point P, the effective curve sub-element satisfies that the normal lines of the start point $A_i$ and the end point $B_i$ of the curve sub-element intersect at point Di, and the two normal lines cut the plane to form four areas, and the curve sub-element located in the same area as point P is an effective curve sub-element. Since any curve sub-element of the curve element M is not a straight line segment, in this embodiment, the normal lines of the starting point $A_i$ and the ending point $B_i$ of any curve sub-element are not parallel.

Specifically, let the normal lines of the start point and the end point of the i-th curve sub-element intersect at point Di, and if the i-th curve sub-element and point P are located in the same area formed by the above two normal lines cutting planes (such as area I, area II, area III and area IV in FIG. 3), then the i-th curve sub-element is regarded as an effective curve sub-element, and the curve sub-element that does not meet the above conditions is an invalid curve sub-element, and the effective curve sub-element is selected to enter step 2).

After dividing the curve element M into n segment curve elements, the n segment curve elements are respectively composed of a plurality of effective curve sub-elements and a plurality of invalid curve sub-elements. For the invalid curve sub-element, because it has no practical calculation significance, the mileage and offset of the invalid curve sub-element at point P do not exist.

For the effectiveness of the curve sub-element, the aforementioned intuitive qualitative judgment can be made by drawing with common drawing software.

In this embodiment, based on Embodiment 1, the effectiveness of curve sub-elements is judged in advance after the end of Step 1) and before the calculation in Step 2). The intention is that the purpose is that, among several curve sub-elements, it is obvious that the distance and/or orientation deviation between some curve sub-elements and known points is relatively large. For the calculation results of such curve sub-elements, the absolute value of offset in inverse calculation will obviously be greater than other curve sub-elements with relatively small distance and/or azimuth deviation. Therefore, for the actual purpose of mileage inverse calculation, we can directly remove it without calculation, and this screening method will not affect the final result. Through the method provided by this embodiment, we can clear it before further calculation, thus reducing the amount of calculation and improving the calculation efficiency.

In this embodiment, other unmentioned parts are the same as in Embodiment 1.

Embodiment 3

On the basis of Embodiment 2, this embodiment further provides a quantitative judgment method for judging the effectiveness of curve sub-elements, as follows:

According to the above method, calculate the rotation angle $\gamma_{i1}$ of azimuth $t_{Ai}$ turning azimuth $t_{AiP}$ and the rotation angle $\gamma_{i2}$ of azimuth $t_{Bi}$ turning azimuth $t_{BiP}$. If $\gamma_{i1}<0$ and $\gamma_{i2}>0$, the curve sub-element is an effective curve sub-element, otherwise it is an invalid curve sub-element, where $t_{Ai}$ and $t_{Bi}$ are the right normal directions of the starting point $A_i$ and the ending point $B_i$ of the curve sub-element, set the clockwise rotation angle as positive, and the absolute values of $\gamma_{i1}$ and $\gamma_{i2}$ are less than 180°.

This embodiment provides a quantitative judgment method for judging the effectiveness of a curve sub-element. By calculating the orientation of the starting point and the ending point of the curve sub-element to a known point, and calculating the rotation angle of the right normal orientation of the starting point and the ending point of the curve sub-element to the above orientation, the judgment result can be obtained. This method is simple in calculation, programmable in judgment, and especially can significantly improve the calculation efficiency by combining with auxiliary tools such as computers.

The significance of pre-judging the effectiveness of the curve sub-element lies in that when the distance between the i-th curve sub-element and the known point is obviously far, or the P-point and the i-th curve sub-element are not in the same area, the curve sub-element is skipped for the related calculation of the next curve sub-element or the mileage and offset of other known coordinate points relative to the curve sub-element are reversely calculated, thereby reducing the calculation amount and improving the calculation efficiency. This screening method will not affect the final result.

In this embodiment, other unmentioned parts are the same as in Embodiment 2.

For the purpose of brevity and highlighting the theme, the same parts of the above-mentioned embodiments have been omitted, so please refer to each other. The above is only the preferred embodiment of the invention, and it is not used to limit the invention. Any modification, equivalent substitution and improvement made within the spirit and principle of the invention should be included in the protection scope of the invention.

The invention claimed is:

1. A method tor inversion calculating mileage and offset of a path between known locations, comprising:
    measuring coordinates of a first one of the known locations P and curve elements to obtain a rotation angle β of the curve element, where the first known location P is an actual position of an area to be constructed,
    dividing the curve elements into n segment curve sub-elements according to a preset rotation angle, and calculating the curve elements corresponding to the segment curve sub-elements according to the curve elements and rotation angles of each of the segment curve sub-elements, wherein the rotation angles β of the curve elements are greater than or equal to 0°, and the rotation angles of the segment curve sub-elements are less than 180° and greater than or equal to 0°;
    taking a connecting line between a start location $A_i$ and an ending location $B_i$ of an i-th segment curve sub-element as a chord line $A_iB_i$, taking a point $O_i$ as a midpoint of the chord line $A_iB_i$, and calculating a straight-line rotation angle $\theta_i$ and a length $S_i$ of $A_iB_i$ or $B_iO_i$ according to curve elements of the i-th segment curve sub-element and the coordinates of the first known location P, wherein the straight-line rotation angle $\theta_i$ is an included angle between a first azimuth $t_{AiBi}$ and a second azimuth $t_{OiP}$, and the straight-line rotation angle $\theta_i$ is less than 180° and greater than or equal to 0°, the first azimuth $t_{A_iB_i}$ points from $A_i$ to $B_i$, and the second azimuth $t_{O_iP}$ points from $O_i$ to the first known location P;

when a length $S_i$ of $A_iO_i$ or $B_iO_i$ is greater than a preset precision, making a judgment and correction as follows:

when $\theta i<90°$, a correction mileage $L_i'=L_{Ai}+S_i$, where $L_{Ai}$ is a starting mileage of the i-th segment curve sub-element, and calculating coordinates of a correction point and its tangent orientation of the correction mileage $L_i'$ corresponding to the i-th segment curve sub-element according to the curve elements of the i-th segment curve sub-element to obtain the i-th segment curve sub-element with the correction point as a start location $B_i$ as an ending location;

when $\theta_i \geq 90°$, the correction mileage $L_i'=L_{Bi}-S_i$, where $L_{Bi}$ is a terminal mileage of the i-th segment curve sub-element, and calculating the coordinates of the correction point and its tangent orientation of the correction mileage $L_i'$ corresponding to the i-th segment curve sub-element according to the curve elements of the i-th segment curve sub-element to obtain an i-th segment correction curve sub-element with the correction point as the ending location and the $A_i$ point as the start location;

then replacing the i-th curve sub-element with the i-th correction curve sub-element in calculating the straight-line rotation angle $\theta_i$ and the length $S_i$ of $A_iO_i$ or $B_iO_i$;

when the length $S_i$ of $A_iO_i$ or $B_iO_i$ is not greater than the preset precision, calculating a distance $F_{O_iP}$ from the first known location P to $O_i$ as equal to an offset of the i-th segment curve sub-element corresponding to the first known location P, and taking a middle mileage of a start location mileage and an end location mileage of the i-th segment curve sub-element as a mileage of the i-th segment curve sub-element corresponding to the first known location P; and repeating calculating the straight-line rotation angle $\theta_i$ and the length $S_i$ of $A_iO_i$ or $B_iO_i$ and making the judgment and correction for all curve sub-elements until inverse calculating the mileage and offset of the first known location P corresponding to all curve sub-elements, determining an effective mileage and offset of the first known location P in combination with an actual situation, and comparing the effective mileage and offset of the first known location P with an offset corresponding to a design mileage in a design stage to judge whether it meets design requirements;

wherein the curve elements include the mileage, radius, tangent azimuth and coordinates of the start location and the ending location of the curve elements or segment curve sub-elements, the tangent azimuth of any mileage point of the curve elements point to a mileage increasing direction, and n and i are integers greater than 0.

2. The method for inversion calculating the mileage and offset of the path according to claim 1, wherein:

when the rotation angle of one of the curve elements is greater than or equal to 180°, the one curve element is divided into m segments of curve sub-elements with a same first rotation angle, where n=m or n=m+1 or n=m+2, m is an integer greater than 0, and the first rotation angle is less than 180°.

3. The method for inversion calculating the mileage and offset of the path according to claim 2, wherein:

when the rotation angle of one of the curve elements is greater than or equal to 180°, the one curve element is further divided into an additional 1-2 segments of curve sub-elements with second rotation angles, where the second rotation angles are less than 180°.

4. The method for inversion calculating the mileage and offset of the path according to claim 1, wherein:

when n≥2, increasing a sequence from an end mileage of the first segment curve sub-element to an end mileage of an nth segment curve sub-element, starting from the start location of a corresponding one of the curve elements, taking the start location of the corresponding curve element as the start location of the first segment curve sub-element, combining it the start location of the first segment curve sub-element with the rotation angle of the first segment curve sub-element, calculating the curve elements of the first segment curve sub-element using a complex Simpson formula, taking the end location of the first segment curve sub-element as the start location of a second segment curve sub-element, and continuously calculating the curve elements of the second segment curve sub-element by combining with the rotation angle of the second segment curve sub-element, and repeating taking an end location of a current segment curve sub-element as a start location of a next segment curve sub-element, and continuously calculating the curve elements of the next segment curve sub-element by combining with the rotation angle of the next segment curve sub-element to calculate the curve elements of all segment curve sub-elements;

or, starting from the end location of the curve element, taking the end location of the curve element as the end location of the nth segment curve sub-element, combining the end location of the nth segment curve sub-element with the rotation angle of the n-th segment curve sub-element, calculating the curve elements of the n-th segment curve sub-element using the complex Simpson formula, taking the start location of the n-th segment curve sub-element as the end location of the (n-1-th segment curve sub-element, continuing to calculate the curve elements of the (n-1-th segment curve sub-element by combining with the rotation angle of the (n-1-th segment curve sub-element, and repeating taking a start location of a present segment curve sub-element as the end location of a prior segment curve sub-element, and continuing to calculate the curve elements of the prior segment curve sub-element by combining with the rotation angle of the prior segment curve sub-element to calculate the curve elements of all segment curve sub-elements.

5. The method for inversion calculating the mileage and offset of the path according to claim 1, wherein:

the coordinates and tangent directions of the correction points on the i-th segment curve sub-element corresponding to the correction mileage $L_i'$ are calculated using a complex Simpson formula.

6. The method for inversion calculating the mileage and offset of the path according to claim 1, further comprising:

after calculating the curve elements corresponding to the segment curve sub-elements and before taking the connecting line between the start location $A_i$ and the ending location $B_i$ of the i-th segment curve sub-element as the chord line $A_iB_i$, judging a validity of the curve sub-element, and selecting an effective curve sub-element for taking the connecting line between the start location $A_i$ and the ending location $B_i$ of the i-th segment curve sub-element as the chord line $A_iB_i$; when a normal line of the start location $A_i$ and a normal line of the end location $B_i$ of the curve sub-element intersect at a second location Di or are parallel to each other, forming several areas from a normal line cutting plane of the start location $A_i$ and the ending point $B_i$ of the curve sub-element, and the curve sub-element in a same area as the first known location P is an effective curve sub-element.

7. The method for inversion calculating the mileage and offset of the path according to claim 5, further comprising:
calculating a rotation angle $\gamma_{i1}$ of an azimuth $t_{ai}$ turning to an azimuth $t_{AiP}$ and a rotation angle $\gamma_{i2}$ of an azimuth $t_{Bi}$ turning to an azimuth $t_{BiP}$,
wherein when $\gamma_{i1}<0$ and $\gamma_{i2}>0$, the curve sub-element is a valid curve sub-element, otherwise it is an invalid curve sub-element, and
when $t_{Ai}$ and $t_{Bi}$ are right normal line directions of the start location $A_i$ and the end location $B_i$ of the i-th segment curve sub-element, Setting a clockwise rotation angle as positive, and absolute values of $\gamma_{i1}$ and $\gamma_{i2}$ are less than 180°.

8. The method for inversion calculating the mileage and offset of the path according to claim 1, wherein:
the preset precision is less than or equal to 2 mm.

9. The method for inversion calculating the mileage and offset of the path according to claim 1, wherein:
when the length $S_i$ of $A_iO_i$ or $B_iO_i$ is not greater than the preset precision, a distance $F_{OiP}'$ from the first known location P to the point $O_i$ is calculated as equal to an absolute value of an offset of the first known location P corresponding to the i-th segment curve sub-element, and an offset $F_{OiP}$ of the first known location P corresponding to an i-th subsegment curve element is calculated according to the following formula:

$$F_{OiP}=F_{OiP}'\times\mathrm{sign}(\sin(t_{OiP}-t_{AiBi}))$$

wherein when $F_{OiP}<0$, the first known location P is on a left side of an increasing direction of the mileage of the curve element in the i-th subsegment; and when $F_{OiP}>0$, the first known location P is on a right side of the increasing direction of the mileage of the curve element in the i-th subsegment.

10. The method for inversion calculating the mileage and offset of the path according to claim 1, wherein:
when there are multiple offsets and mileage corresponding to the first known location P, first ones of the offsets and corresponding mileages from small to large in absolute value are selected as the effective offsets and mileages of curve elements corresponding to the first known location P.

11. The method for inversion calculating the mileage and offset of the path according to claim 1, wherein:
when there are multiple offsets and mileages of curve elements corresponding to the first known location P, the offsets having absolute values less than a preset threshold and corresponding mileages are selected as the effective offsets and mileage of curve elements corresponding to the first known location P.

* * * * *